(12) United States Patent
Tsuji et al.

(10) Patent No.: US 7,418,921 B2
(45) Date of Patent: Sep. 2, 2008

(54) PLASMA CVD APPARATUS FOR FORMING UNIFORM FILM

(75) Inventors: Naoto Tsuji, Tama (JP); Satoshi Takahashi, Tama (JP)

(73) Assignee: ASM Japan K.K., Tokyo (JP)

( * ) Notice: Subject to any disclaimer, the term of this patent is extended or adjusted under 35 U.S.C. 154(b) by 331 days.

(21) Appl. No.: 11/202,492

(22) Filed: Aug. 12, 2005

(65) Prior Publication Data

US 2007/0037390 A1 Feb. 15, 2007

(51) Int. Cl.
*C23C 16/00* (2006.01)
(52) U.S. Cl. ........... 118/723 E; 118/728; 118/723 MW; 156/345.47; 156/345.51; 438/680
(58) Field of Classification Search ............. 118/723 E, 118/728, 723 MW; 156/345.47, 345.51; 438/680

See application file for complete search history.

(56) References Cited

U.S. PATENT DOCUMENTS 6,631,692 B1 * 10/2003 Matsuki et al. .......... 118/723 E 6,692,576 B2 * 2/2004 Halpin et al. ............... 118/730

FOREIGN PATENT DOCUMENTS

JP 3207147 7/2001

OTHER PUBLICATIONS

Naoto Tsuji, et al., Plasma CVD Film-Forming Device, Invention Association Publication No. 2002-1338, issued Mar. 1, 2002, p. 1-2.

* cited by examiner

*Primary Examiner*—Alexander G Ghyka
(74) *Attorney, Agent, or Firm*—Knobbe, Martens, Olson & Bear LLP

(57) ABSTRACT

A plasma CVD film formation apparatus includes: a reaction chamber; a shower plate installed inside the reaction chamber; and a susceptor for placing a wafer thereon installed substantially parallel to and facing the shower plate. The shower plate has a surface facing the susceptor, which is configured using a convex shape toward a center as a basic shape and overlaying at least one equation thereon, and the susceptor supports the wafer at a peripheral portion and at a position between a central portion and the peripheral portion.

14 Claims, 10 Drawing Sheets

Average 9930Å

PLASMA CVD APPARATUS FOR FORMING UNIFORM FILM

BACKGROUND OF THE INVENTION

1. Field of the Invention

The present invention generally relates to a semiconductor manufacturing apparatus, and specifically to a plasma CVD film formation apparatus that comprises a shower plate and a susceptor having unique shapes and achieves favorable wafer temperature distribution as well as film thickness and quality distributions.

2. Description of the Related Art

FIG. 1 shows an overview of a conventional plasma processing apparatus. This plasma processing apparatus 1 has a reaction chamber 6, a gas introduction port 5, and a second electrode comprising a susceptor 3 and a heater 2. The second electrode may be structured with its susceptor 3 and heater 2 brazed together, as disclosed in U.S. Pat. No. 3,207,147. Gas is introduced from the gas introduction port 5 through a gas line (not shown). A round-shaped first electrode 9 is placed immediately below the gas introduction port 5. The first electrode 9 has a hollow structure, and its bottom surface has many pores through which gas is injected toward a wafer 4. To facilitate maintenance and reduce parts costs, the first electrode 9 is also constructed in such a way that a shower plate 11 having multiple gas introduction holes can be replaced.

At the bottom of the reaction chamber 6 is an exhaust port 10. This exhaust port 10 is connected to an external vacuum pump (not shown), through which the interior of the reaction chamber 6 is evacuated. The susceptor 3 is placed parallel to and facing the first electrode 9. The susceptor 3 holds the wafer 4 on top, and heats the wafer 4 continuously by means of the heater 2 to maintain the substrate 4 at a specified temperature (150 to 450° C.). The gas introduction port 5 and first electrode 9 are insulated from the reaction chamber 6, and connected to a first high-frequency power supply 7 provided externally. In some cases, a second high-frequency power supply 8 is also connected. Numeral 12 indicates grounding. Consequently, the first electrode 9 and second electrode function as high-frequency electrodes and create a plasma reaction field near the wafer 4. The type and quality of the film formed on the surface of the wafer 4 vary in accordance with the type and flow rate of material gas, temperature, radio frequency type, spatial distribution of plasma, and potential distribution.

To form C-doped silicon oxide film offering a low dielectric constant, silicon hydrocarbons containing multiple alkoxy groups is used in combination with Ar and/or He. In some cases, alcohols, ethers, unsaturated hydrocarbons and the like may be used as bridging gases. In other cases, oxidizing gases such as ozone, oxygen and nitrous suboxide may be used.

The uniformity of the film formed on the wafer is closely correlated to the gas holdup time and plasma density in the reaction area. As shown in FIG. 1, the distance between the susceptor 3 and shower plate 11, or distance between the wafer 4 and shower plate 11, remains constant on the conventional plasma CVD film formation apparatus. Generally on a parallel-plate plasma CVD film formation apparatus, the distribution of electric field strengths between the two plate electrodes (Ø250 mm) presents a trend where the electric field strength becomes the greatest at the center and decreases gradually towards the outside in the radial direction, as described in U.S. Pat. No. 6,631,692. Based on this distribution trend, the electric field strength is approx. ±5% in the film deposition area on a Ø200 mm wafer, and the distribution band increases further on a ◯300 mm wafer. For this reason, the electric field near the center of the wafer 4 is relatively stronger than in the electric field away from the center in the radial direction, and accordingly the plasma density and gas reaction rate are also higher near the center. In addition, although the gas reaction rate is affected by the holdup time of gas in the reaction space, in an example using a conventional plasma CVD film formation apparatus the film thickness became the greatest near the center, indicating that the film thickness distribution is strongly affected by the plasma density. In cases like this, the film thickness distribution has traditionally been corrected by controlling the gas flow rate, mixing ratio of component gases, pressure, radio frequency and radio frequency power output. However, changing these parameters also changes the film thickness and deposition speed, which in turn reduces the stability of the process. In addition, oftentimes the film quality does not have a uniform distribution unless the wafer temperature distribution is uniform.

FIG. 2 illustrates the susceptor 3 and shower plate 11 reported by the inventors of the present invention in a technical bulletin published by the Japan Institute of Invention and Innovation (Technical Disclosure No. 2002-1338). In this figure, the susceptor 3 is placed on top of a heater 2 and the susceptor surface on which a wafer 4 is supported has a concave shape. The distance (db) from the back face of the wafer 4 to the center of this concave surface (the depth of the concave) is 0.1 to 4 mm, and it is stated that the wafer 4 should ideally contact the susceptor 3 only at its periphery. The shower head 11 has a convex shape, and the deformation rate (fd) of the shower head 11, as defined by the equation (dc−da)/da×100 (wherein dc is the distance between the showerhead and wafer at the center, and da is the distance between the showerhead and wafer at the periphery) is in a range of −1% to −20%. The report states that this shape allows for formation of film having uniform thickness and quality. However, the inventors of the present invention subsequently discovered that the aforementioned structure would not provide a uniform wafer temperature distribution, nor would it provide uniform film thickness or quality distribution, if wafers of large areas, such as those with a diameter of 300 mm, are processed.

SUMMARY OF THE INVENTION

Consequently, in an aspect, an object of the present invention is to provide a plasma CVD film formation apparatus and method for rendering temperature distributions of a wafer uniform and forming a film having uniform thickness and uniform quality.

In another aspect, an object of the present invention is to prevent deposition of particles on a back side of a wafer.

In yet another aspect, an object of the present invention is to provide a plasma CVD film formation apparatus having simple configurations and low manufacturing costs.

In still another aspect, an object of the present invention is to provide a method of designing a shower plate which enables formation of a uniform film.

The present invention can accomplish one or more of the above-mentioned objects in various embodiments. However, the present invention is not limited to the above objects, and in embodiments, the present invention exhibits effects other than the objects.

In an aspect, the present invention provides a plasma CVD film formation apparatus comprising: (i) a reaction chamber (vacuum chamber); a shower plate installed inside the reaction chamber; and a susceptor for placing a wafer thereon installed substantially parallel to and facing the shower plate, wherein the shower plate has a surface facing the susceptor, which is configured using a convex shape toward a center as a basic shape and overlaying at least one equation (e.g., 1, 2, 3 equations) thereon, and wherein the susceptor supports the wafer at a peripheral portion and at a position between a central portion and the peripheral portion.

The above embodiment includes, but is not limited to, the following embodiments:

The shower plate may have a shape where the central portion is convex with a height of about 0.5 mm to about 3.5 mm (including 1 mm, 1.5 mm, 2.0 mm, 2.5 mm, 3.0 mm, and values between any two numbers of the foregoing). Further, a function of R (radius) to the second power with a top vertex may be overlaid on a portion where a film formed when using the basic shape is relatively thick, and a function of R to the second power with a bottom vertex may be overlaid on a portion where a film formed when using the basic shape is relatively thin.

In an embodiment, the susceptor may support the wafer at any position within a region defined by a distance from a center, which is about 40% to about 60% (including 45%, 50%, 55%, and values between any two numbers of the foregoing) of a radius of the wafer, and at any position within a region defined by a distance from the center, which is about 90% to 100% (including 92%, 95%, 97%, and values between any two numbers of the foregoing) of the radius of the wafer.

In an embodiment, the susceptor may comprise a heater element embedded therein within a region defined by a distance from a center, which is about 20% to about 60% (including 25%, 30%, 40%, 45%, 50%, 55% and values between any two numbers of the foregoing) of a radius of the wafer.

In all of the aforesaid embodiments, any element used in an embodiment can interchangeably be used in another embodiment unless such a replacement is not feasible or causes adverse effect. Further, the present invention can equally be applied to apparatuses and methods.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

Figure 1:
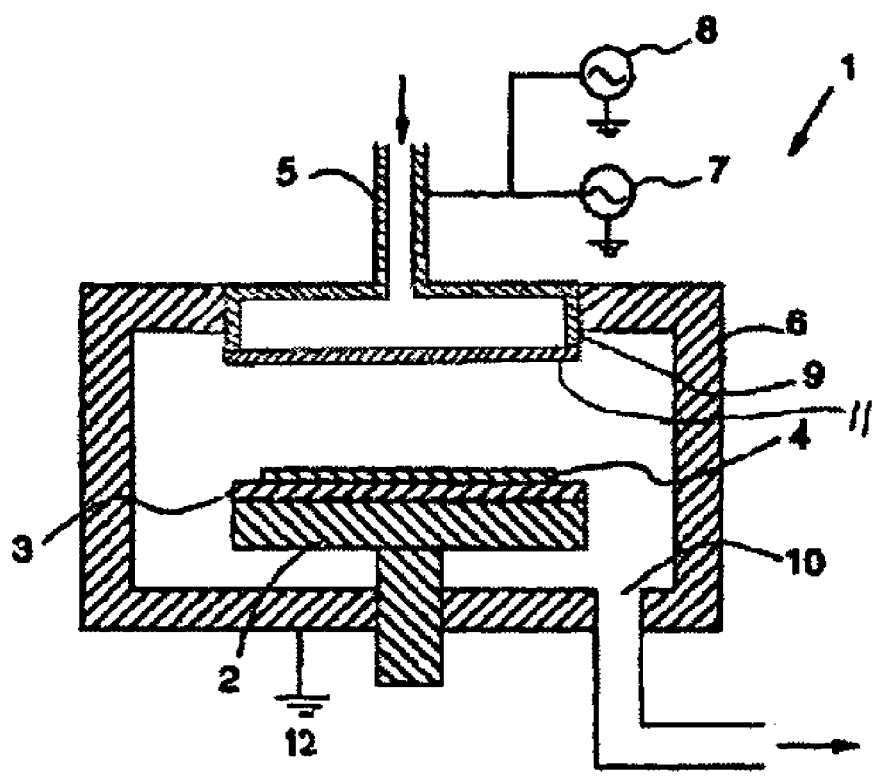
FIG. 1 is a schematic diagram of a conventional plasma CVD apparatus. The drawing is oversimplified for illustrative purposes.

The present invention will be explained in detail with reference to preferred embodiments. However, the preferred embodiments are not intended to limit the present invention.

In an embodiment, a plasma CVD apparatus for forming a thin film on a wafer, comprises: (i) a reaction chamber; (ii) a susceptor for placing the wafer thereon installed inside the reaction chamber and having a convex-concave surface comprising an inner annular convex portion and an outer annular convex portion which are concentrically formed, wherein the inner annular convex portion is configured to support the wafer at a portion between a center and a periphery of the wafer, and the outer annular convex portion is configured to support the wafer at its periphery; and (iii) a shower plate for discharging a gas therethrough installed inside the reaction chamber substantially parallel to and facing the susceptor for generating a plasma therebetween, said shower plate having a convex-concave surface configured by a convex equation L which is a function of a radius R, on which a secondary equation M is overlaid, wherein the equation M is a function of a radius R and comprised of a concave equation at a central area and a convex equation at a peripheral area.

The above embodiment includes, but is not limited to, the following embodiments:

The convex-concave surface of the shower plate may comprise an inner annular protrusion formed between an area defined by the concave equation and an area defined by the convex equation in the equation M, and an outer annular protrusion formed and defined by the convex equation in the equation M. Respective locations of the inner annular convex portion and the outer annular convex portion of the susceptor defined using a radius R may be overlapped with respective locations of the inner annular protrusion and the outer annular protrusion of the shower plate defined using a radius R.

Respective locations of the shower plate where the concave equation and the convex equation in the equation M are overlaid may correspond to respective locations of a relatively thin portion and a relatively thick portion of a film formed on a wafer using a shower plate having a surface configured by the equation L.

In an embodiment, the equation M may be a function of R to the second power. The equation M may be expressed by $$M = h\left(1 - \frac{(R-j)^2}{i}\right),$$

wherein h, i, and j are coefficients.

In an embodiment, the equation L may be expressed by $$L = \frac{e^2 f}{R^2 + e^2} - \frac{e^2 f}{g^2 + e^2},$$

wherein e, f, and g are constants.

The equation L can be circular or oval or exponential as long as a convex shape is defined.

In an embodiment, the equation L may be such that a height of a convex portion of the shower plate at a center is about 0.5 mm to about 3.5 mm.

The inner convex portion of the susceptor may be arranged within a region defined by a distance from a center, which is about 40% to about 60% of a radius of the wafer, and the outer convex portion of the susceptor is arranged within a region defined by a distance from the center, which is about 90% to 100% of the radius of the wafer.

The susceptor may comprise a heater element embedded therein within a region defined by a distance from a center, which is about 20% to about 60% of a radius of the wafer.

The inner and outer convex portions of the susceptor each may have a height of about 0.2 mm to about 1.5 mm (including 0.3 mm, 0.5 mm, 0.7 mm, 1.0 mm, and values between any two numerals of the foregoing).

In all of the aforesaid embodiments, any element used in an embodiment can interchangeably be used in another embodiment unless such a replacement is not feasible or causes adverse effect. Further, the present invention can equally be applied to apparatuses and methods.

In an embodiment, a method for forming a thin film on a wafer may comprise: (a) providing a susceptor for placing the wafer thereon installed inside a reaction chamber and having a convex-concave surface comprising an inner annular convex portion and an outer annular convex portion which are concentrically formed, wherein the inner annular convex portion is configured to support the wafer at a portion between a center and a periphery of the wafer, and the outer annular convex portion is configured to support the wafer at its periphery; (b) providing a shower plate for discharging a gas therethrough installed inside the reaction chamber substantially parallel to and facing the susceptor for generating a plasma therebetween, said shower plate having a convex-concave surface configured by a convex equation L which is a function of a radius R, on which a secondary equation M is overlaid, wherein the equation M is a function of a radius R and comprised of a concave equation at a central area and a convex equation at a peripheral area; (c) adjusting a temperature of the susceptor; (d) placing the wafer on the susceptor; (e) supplying a gas to the reaction chamber through the shower plate; and (f) applying RF power between the shower plate and the susceptor, thereby depositing a film on the wafer.

The above embodiment includes, but is not limited to, all of the aforesaid embodiments.

In another embodiment, a method of designing a shower plate for a plasma CVD apparatus may comprise: (A) providing a susceptor for placing the wafer thereon installed inside a reaction chamber and having a convex-concave surface comprising an inner annular convex portion and an outer annular convex portion which are concentrically formed, wherein the inner annular convex portion is configured to support the wafer at a portion between a center and a periphery of the wafer, and the outer annular convex portion is configured to support the wafer at its periphery; (B) providing a shower plate for discharging a gas therethrough installed inside the reaction chamber substantially parallel to and facing the susceptor for generating a plasma therebetween, said shower plate having a convex surface configured by a convex equation L which is a function of a radius R; (C) determining a distribution of thickness of a film formed on the wafer, which includes a relatively thin portion and a relatively thick portion of the film formed on the wafer; (D) determining respective locations of the shower plate where a concave equation and a convex equation which are each a function of a radius R and constitute an equation M are overlaid on the equation L, which locations correspond to respective locations of the relatively thin portion and the relatively thick portion of the film; and (E) determining the equation M; (F) providing a convex-concave surface of a shower plate configured by the equation L, on which the equation M is overlaid.

The above embodiment includes, but is not limited to, all of the aforesaid embodiments.

When the basic convex susceptor is used, a depositing film tends to be thin at a center, and show interference fringe-like concentric unevenness. The basic convex susceptor can be selected based on an analysis of thickness distributions of a film formed on a wafer. Preferably, among convex susceptors, a susceptor capable of forming a most uniform film can be selected. The equation M can be determined based on the thickness distributions of a film using the selected convex susceptor. The equation M is preferably a function of R to the second power. However, it can be a function of a partial circle or oval or in combination of two or more functions. A function with a top vertex can be overlaid on a portion where the film is relatively thick, and a function with a bottom vertex can be overlaid on a portion where the film is relatively thin. As a result, a vertical cross-section of the shower plate in an axial direction may have a shape which is generally a reversed shape of the thickness distribution profile of the film.

The equation M can be a single equation with coefficients which vary depending on R. By using coefficients, even when the single equation is used, various convex and concave equations can be produced as a function of R. Alternatively, the equation M can be comprised of multiple equations of different types (which cannot be simplified to a single equation).

A wafer-to-be-processed may be in any size and includes a 200 mm wafer and 300 mm wafer. Because in at least one embodiment, a uniform film (uniform thickness and/or uniform quality within the film) can be formed, and thus a wafer having a relatively large diameter may suitably be used.

The present invention will be explained with reference to examples and drawings. However, the examples and the drawings are not intended to limit the present invention. Incidentally, in the examples, specific values are used. However, normally, the values can be modified in the range of ±50%, preferably ±20%, in another embodiments.

EXAMPLE 1

Figure 3:
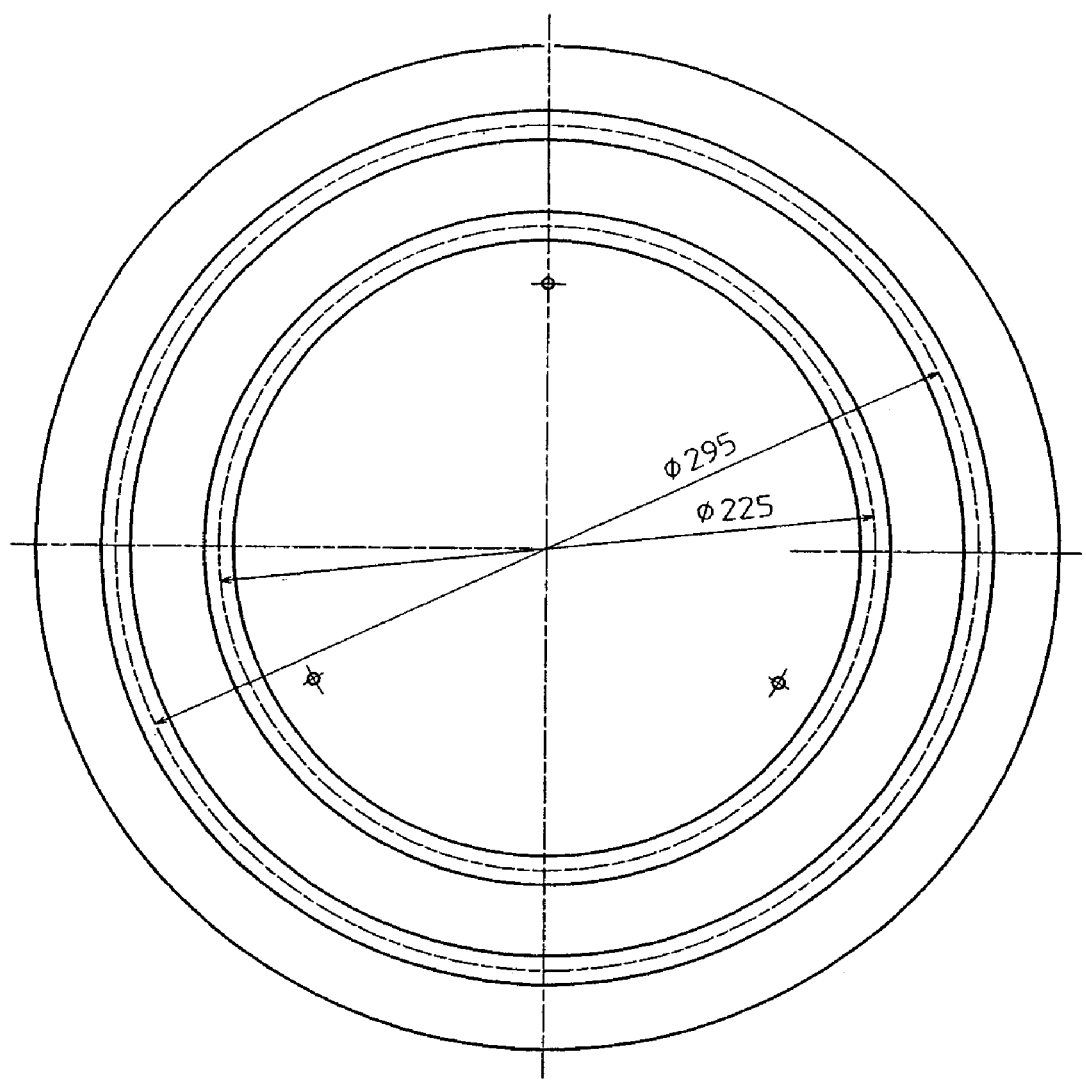
FIG. 3 is a schematic diagram of a comparative susceptor provided with a heater element. The drawing is oversimplified for illustrative purposes.
Figure 3:
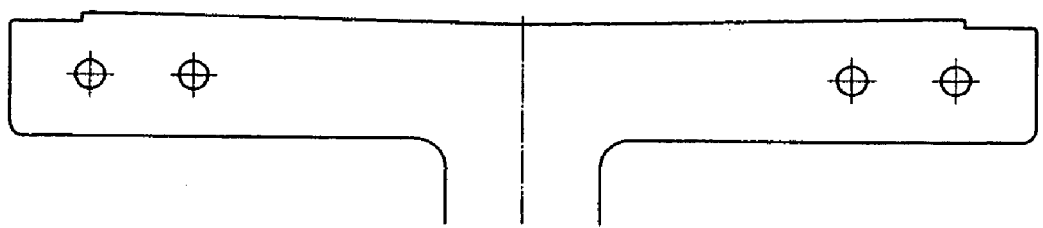
Figure 4:
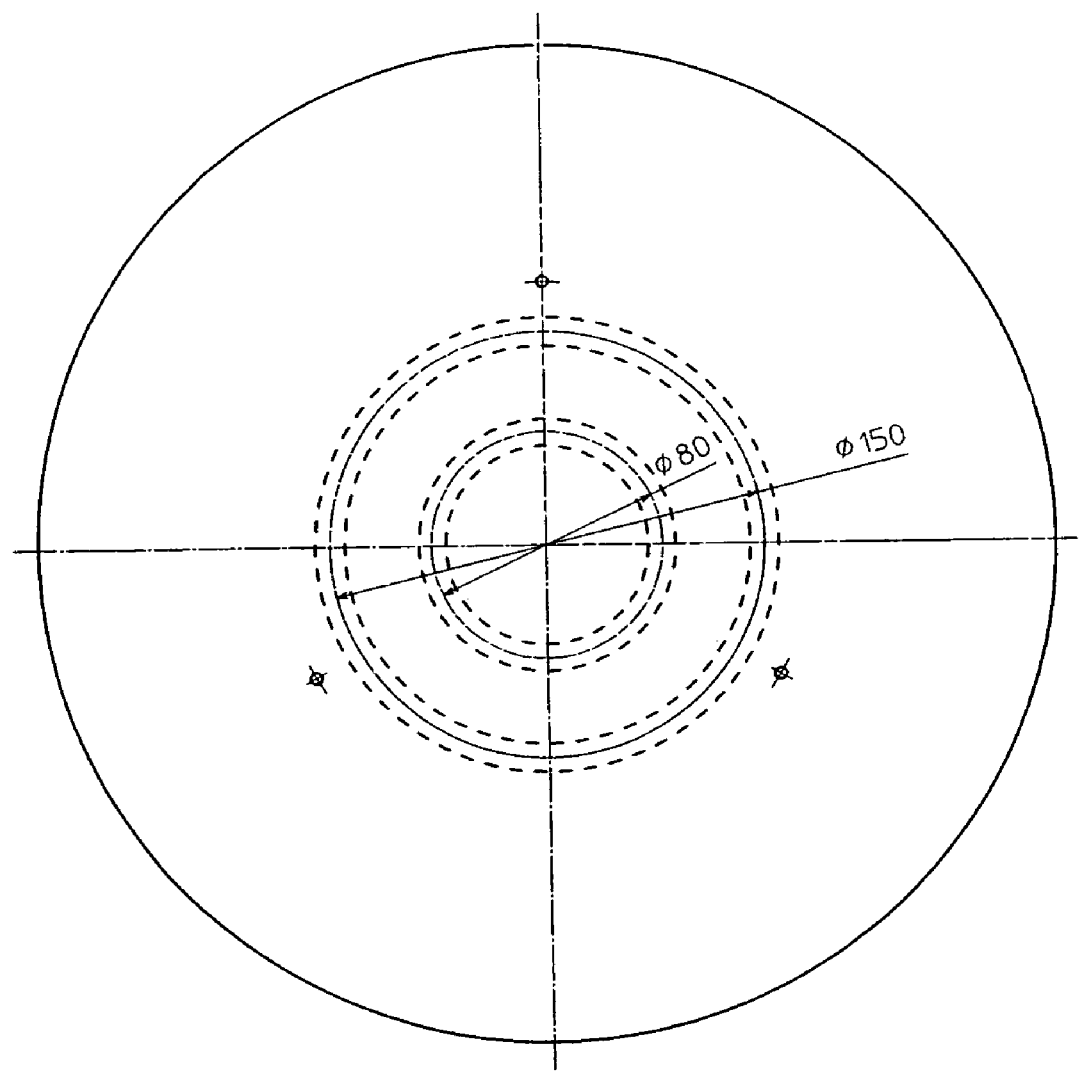
FIG. 4 is a schematic diagram of a susceptor provided with a heater element according to an embodiment of the present invention. The drawing is oversimplified for illustrative purposes.
Figure 4:
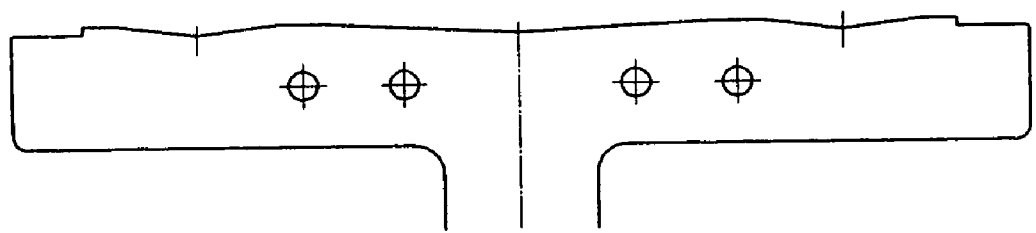

Comparison of temperature distribution between the comparative susceptor shown in FIG. 3 and the susceptor in the embodiment shown in FIG. 4

FIG. 3 shows the comparative susceptor and comparative heater element position. The wafer is held at the periphery of the susceptor and the center concave of the susceptor is 1.2 mm deep. The wafer holding part at the periphery of the susceptor is located in a range of Ø270 to Ø300, corresponding to 90 to 100% of the wafer diameter from the center of the susceptor. The heater element is located in a range of Ø220 to Ø300.

FIG. 4 shows the susceptor and heater element position in one embodiment conforming to the present invention. It should be noted, however, that the present invention is not at all limited to what is illustrated in this figure. The wafer is held at the periphery of the susceptor as well as at an intermediate part between the center and periphery, and the concave of the susceptor is 0.7 mm deep. The intermediate wafer holding part is located in a range of 120 to Ø180, corresponding to 40 to 60% of the wafer diameter from the center of the susceptor. The wafer holding part at the periphery of the susceptor is located in a range of Ø270 to Ø300, corresponding to 90 to 100% of the wafer diameter from the center of the susceptor. The heater element is positioned in a range of Ø220 to Ø300.

FIG. 4 shows the susceptor and heater element position in one embodiment conforming to the present invention. It should be noted, however, that the present invention is not at all limited to what is illustrated in this figure. The wafer is held at the periphery of the susceptor as well as at an intermediate part between the center and periphery, and the concave of the susceptor is 0.7 mm deep. The intermediate wafer holding part is located in a range of Ø120 to Ø180, corresponding to 40 to 60% of the wafer diameter from the center of the susceptor. The wafer holding part at the periphery of the susceptor is located in a range of Ø270 to Ø300, corresponding to 90 to 100% of the wafer diameter from the center of the susceptor. The heater element is positioned in a range of Ø220 to Ø300.

In this example, a shower plate of the basic shape having a convex center of 1.5 mm in height was used. The shape illustrated in FIG. 5 is expressed by the equations below:

$$Zs = L + M$$
$$L = \frac{e^2 f}{R^2 + e^2} - \frac{e^2 f}{g^2 + e^2}$$
$$M = 0$$

Here, Zs represents height and R represents radius ($0 \leq R \leq 163$), while e, f and g are constants (e=266, f=5.5, g=163). For these constants, desired values can be selected as deemed appropriate in accordance with the basic shape of the susceptor. M is a representation of overlaid quadratic functions, but it takes 0 with a shower plate of the basic shape. Zs becomes 0 if $163 \leq R \leq 175$.

Figure 2:
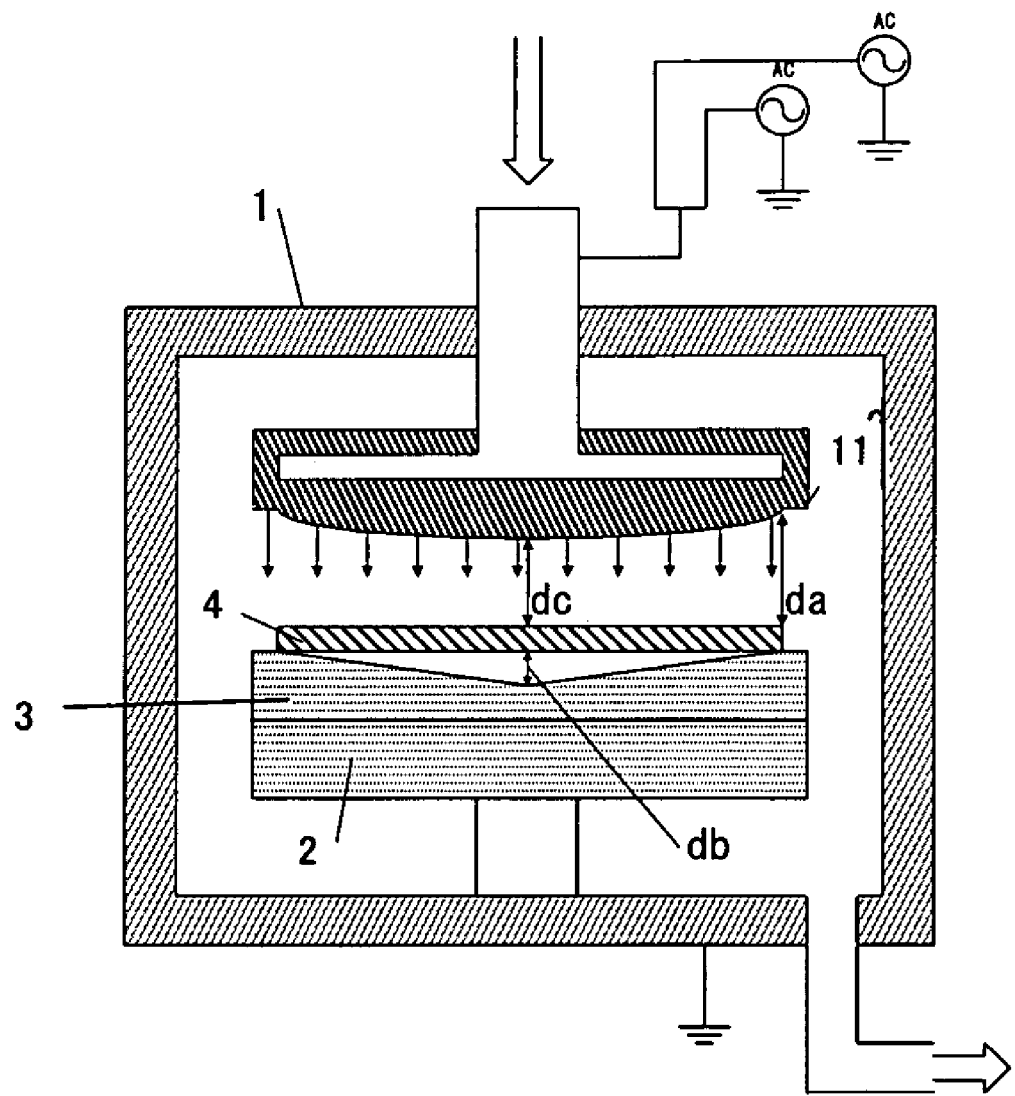
FIG. 2 is a schematic diagram of another conventional plasma CVD apparatus. The drawing is oversimplified for illustrative purposes.
Figure 5:
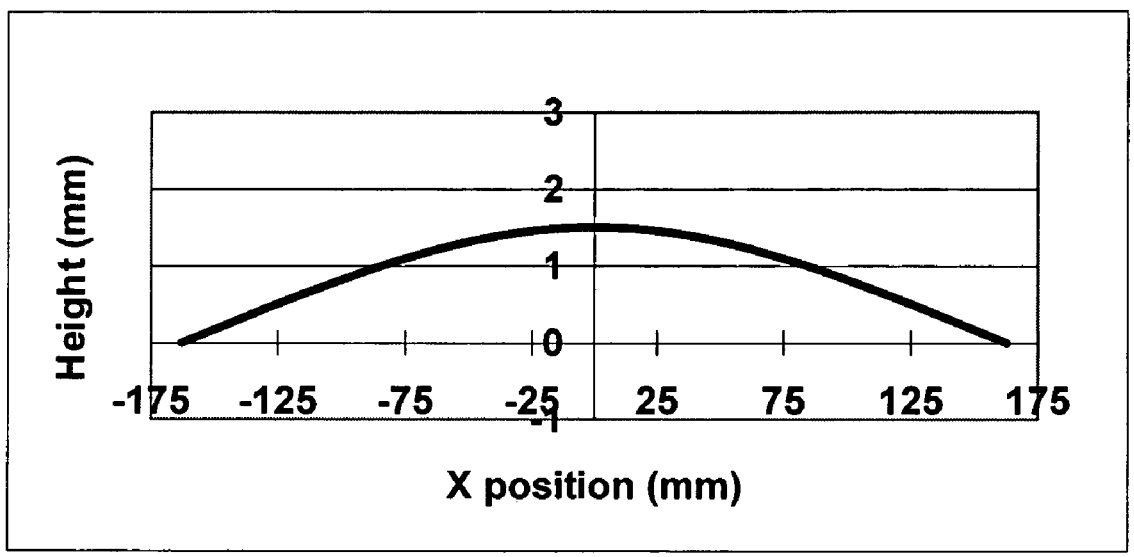
FIG. 5 is a graph showing a cross-sectional shape of a basic shower plate.

It should be noted that the basic shower plate shape is not at all limited to the one shown in FIG. 5. Instead, all shower plates of a convex shape like the one illustrated in FIG. 2 can be defined as having the basic shape. In the above equations, L is a function based on $y=1/R^2$. If e is small in the first term of L, similarly to $y=1/R^2$ as R goes to 0, y goes to f. Near R=0, y approximates f in a smooth manner. If e is large, when R=0, y=f, with y approximates f regardless of the value of R. f adjusts the peak height at R=0. In the second term of L, g is used to adjust L to become 0 when R takes the maximum value or minimum value within its range (here, L=0 with R at ±163, representing the position at the start of curve in the convex shape). Therefore, as e increases, L approximates $f-e^2f/(g^2+e^2)$ in a smooth manner near R=0, while y approximates 0 near R=g. Those skilled in the art should be able to design an appropriate convex surface as the basic shape based on the concept described above. In addition to a convex surface provided by an inverse of an exponential function, a convex surface can also be structured as a spherical surface, ellipsoidal surface or other curved surface.

Figure 10:
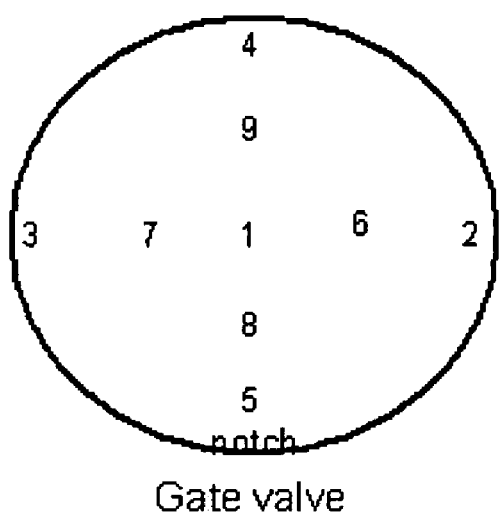
FIG. 10 is a schematic diagram showing positions of thermocouples installed on a surface of a wafer.

Table 2 shows the temperature and pressure in the reaction chamber, while Table 1 shows the distribution of wafer temperatures. Temperature was measured using a wafer fitted with thermocouples. As shown in FIG. 10, temperature was measured at one point at the center, four points along a Ø145 circle, and four points along a Ø290 circle.

TABLE 1

| TC ch | Conventional example Susceptor/heater element position | Present invention Susceptor/heater element position | |
|---|---|---|---|
| 1 | 364.3 | 377.5 | |
| 2 | 381.4 | 379.8 | φ290 |
| 3 | 379.5 | 378.9 | |
| 4 | 376.7 | 377.7 | |
| 5 | 371.7 | 378.8 | |
| 6 | 371.7 | 384.1 | φ145 |
| 7 | 372.0 | 383.6 | |
| 8 | 374.3 | 383.7 | |
| 9 | 369.5 | 383.2 | |
| Center | 364.3 | 377.5 | |
| Mean | 373.5 | 380.8 | |
| Average at periphery | 377.3 | 378.8 | |
| Periphery − Center | 13.0 | 1.3 | |
| Range | 17.1 | 6.6 | |
| 1 σ | 1.40% | 0.73% | |

TABLE 2

| Chamber Temperature [° C.] | | Pressure [Pa] |
|---|---|---|
| First electrode | 170 | 533 |
| Wall | 150 | |
| Heater | 390 | |

As evident from Table 1, the temperature distribution improved significantly to a level where a uniformity corresponding to 1σ being 1% or less could be maintained, by using the susceptor in one embodiment (FIG. 4) of the present invention and the heater element position in one embodiment of the present invention.

EXAMPLE 2

Film thickness distribution based on the susceptor in the embodiment shown in FIG. 4 and the basic shower plate shape shown in FIG. 5

Figure 6:
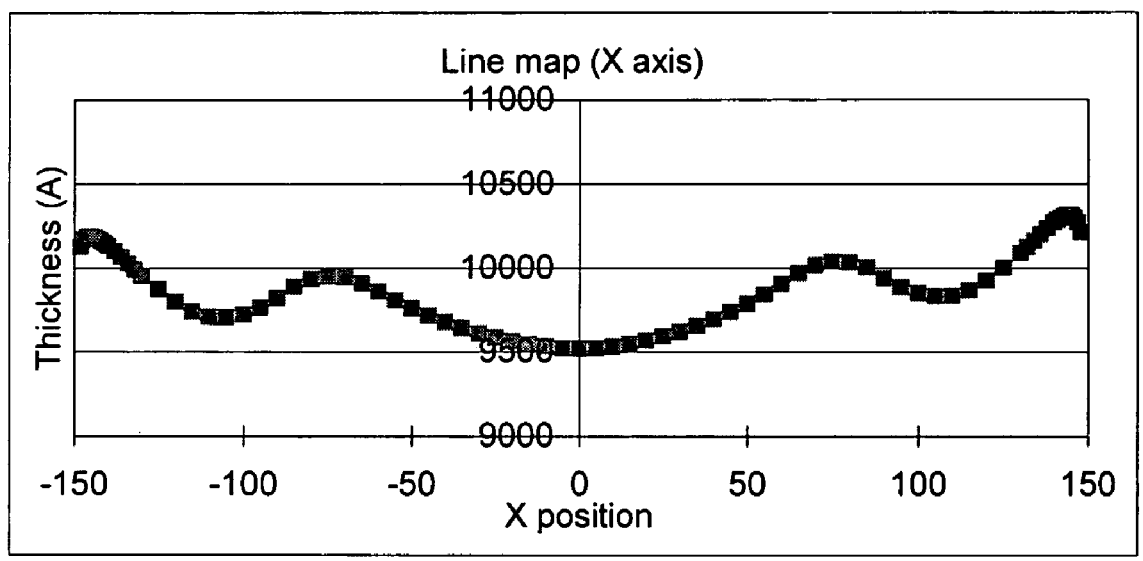
FIG. 6 is a graph showing a film thickness profile using the basic shower plate.

FIG. 6 shows the film thickness distribution measured with a combination of the basic shower plate shape shown in FIG. 5 and the susceptor and heater element position shown in FIG. 4 that conform to the present invention. The film was C-doped silicon oxide film offering a low dielectric constant, and the deposition conditions were as follows:

Deposition Conditions
    First electrode: 170° C.
    Chamber wall: 150° C.
    Heater: 390° C.
    Material gas: DM-DMOS (dimethyl dimethoxy silane), 175 sccm
    Bridging gas: Isopropyl alcohol, 320 sccm
    Additive gas: He, 150 sccm
    First high-frequency power supply: 27.12 MHz, 2.3 W/cm2
    Wafer: 300 mm As explained in Example 1, the temperature distribution is highly uniform because of the use of the susceptor shown in FIG. 4. However, the uniformity of film thickness is not so high, as shown in FIG. 6. The basic shower plate shape (convex) shown in FIG. 5 provides smaller film thickness at the center and greater film thickness at the periphery. As shown, there are locations in between where the film thickness also increases. The measured film thicknesses have a dispersion band of approx. ±5% from the average, with the difference between the maximum film thickness and minimum film thickness being nearly 10%.

EXAMPLE 3

Figure 7:
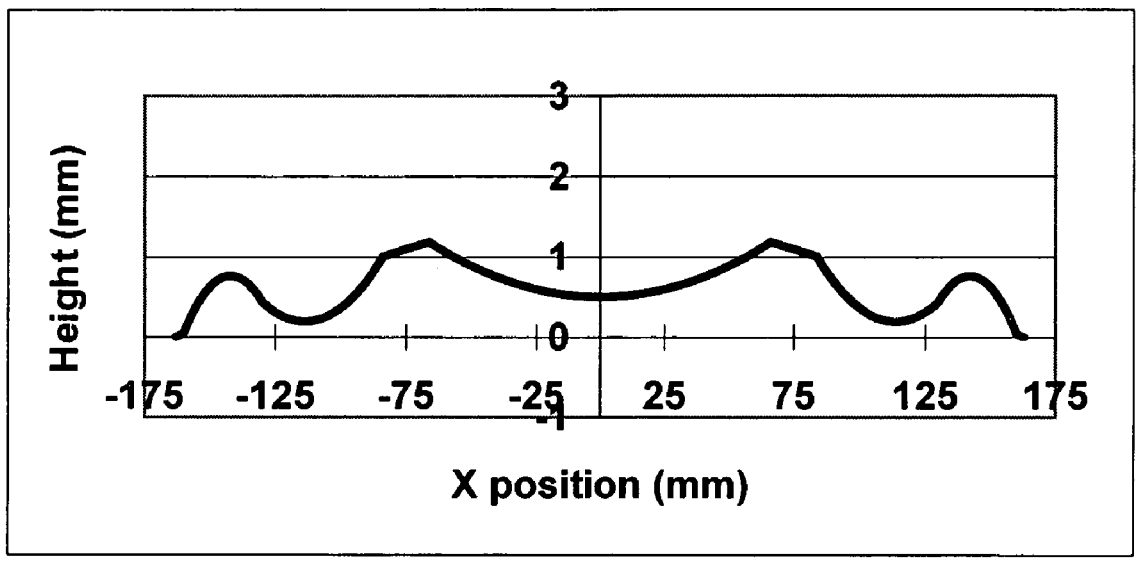
FIG. 7 is a graph showing a cross-sectional shape of a shower plate according to an embodiment of the present invention.

Temperature distribution based on the susceptor in the embodiment shown in FIG. 4 and the shower plate in the embodiment shown in FIG. 7.

FIG. 7 shows the shower plate shape used in this example, which provides one embodiment conforming to the present invention. The shape in FIG. 7 is obtained by overlaying a convex quadratic function on the area of greater film thickness in FIG. 6 and a concave quadratic function on the area of smaller film thickness. This shape is expressed by the equations below:

$$Zs = L + M$$

$$L = \frac{e^2 f}{R^2 + e^2} - \frac{e^2 f}{g^2 + e^2}$$

$$M = h\left(1 - \frac{(R-j)^2}{i}\right)$$

Here, Zs represents height and R represents radius ($0 \leq R \leq 163$), while e, f and g are constants ($e=266$, $f=5.5$, $g=163$). M is calculated using coefficients suitable for the radius range, as specified below:

$0 \leq R < 66$; $h=-10$, $i=4356$, $j=0$ $66 \leq R < 84$; $h=0$, $i=0$, $j=0$ $84 \leq R < 130$; $h=-0.5$, $i=529$, $j=107$ $130 \leq R < 160$; $h=0.5$, $i=225$, $j=145$ $160 \leq R \leq 163$; $h=0$, $i=0$, $j=0$ Zs becomes 0 if $163 \leq R \leq 175$.

In the above example, the shape is corrected using a concave quadratic function. It should be noted, however, that the present invention is not at all limited to quadratic functions. For example, the surface of basic shape can be corrected using other exponential functions or functions representing spherical surface, ellipsoidal surface and other curved surfaces. In one embodiment, M and L may be the same function taking different coefficients. In the above equations, h determines the maximum value or minimum value of the quadratic function. i is a coefficient that causes the quadratic function (M) to yield 0 when R takes the maximum value or minimum value within its range (for example, for M to yield 0 at R=160, i must be $(160-j)2=225$). j is the value of R when the quadratic function yields the maximum value or minimum value (for example, j is 145 if R is at a midpoint of its range such as a value between 130 and 160).

These coefficients can be specified, in the range of R, from the film thickness distribution based on the basic shower plate shape. Basically, these coefficients are selected in such a way that the shower plate surface corresponding to the area of smaller film thickness takes a convex shape, while the shower plate surface corresponding to the area of greater film thickness takes a concave shape. Note, however, that there is no need to adjust the shower plate surface at all locations of non-uniform film thickness over the entire distribution range. Instead, it suffices to adjust the shower plate surface shape one by one from the locations exhibiting greater non-uniformity. In one embodiment, for example, adjustment is performed at two locations at the center and the periphery. In another embodiment, the shower plate has a convex shape at a position corresponding to the area of smaller film thickness (concave), while it has a concave shape at a position corresponding to the area of greater film thickness (convex). In this case, the cross-section profile of film thickness distribution and the cross-section profile of shower plate will have inverse similarity.

In another embodiment, the distance from the center of the wafer supporting part (convex shape) of the susceptor partially overlaps with the distance from the center of the convex surface of the shower plate.

L and M may be circular functions, elliptic functions, quadratic functions, cubic functions or other exponential functions or other functions. L and M can be different functions (functions that cannot be consolidated into one or simplified in any way) in one embodiment, while in another the two may be the same function taking different coefficients. Those skilled in the art should be able to design appropriate overlaying functions in accordance with the concept described above.

Temperature distribution was examined based on the susceptor shown in FIG. 4 and the shower plate shown in FIG. 7. Table 3 summarizes the wafer temperature distribution measured in one embodiment based on the shower plate, susceptor and heater element position conforming to the present invention. The chamber temperatures were set to 170° C. at the first electrode, 150° C. at the chamber wall, and 390° C. at the heater (Table 4). The heater and susceptor were brazed, and the pressure of the nitrogen atmosphere inside the reaction chamber was 533 Pa. Temperature was measured using a wafer fitted with thermocouples. As shown in FIG. 10, temperature was measured at one point at the center, four points along a Ø145 circle, and four points along a Ø290 circle.

TABLE 3

| TC ch | Present invention Susceptor/heater element position | |
|---|---|---|
| 1 | 378.4 | |
| 2 | 380.5 | ϕ290 |
| 3 | 379.5 | |
| 4 | 378.4 | |
| 5 | 379.3 | |
| 6 | 384.6 | ϕ145 |
| 7 | 384.0 | |
| 8 | 384.1 | |
| 9 | 383.6 | |
| Center | 378.4 | |
| Mean | 381.4 | |
| Average at periphery | 379.4 | |
| Periphery − Center | 1.0 | |
| Range | 6.2 | |
| 1 σ | 0.69% | |

TABLE 4

| Chamber Temperature [° C.] | | Pressure [Pa] |
|---|---|---|
| First electrode | 170 | 533 |
| Wall | 150 | |
| Heater | 390 | |

As shown in Table 3, a good temperature distribution with a uniformity corresponding to 1σ being 1% or less was achieved based on the shower plate, susceptor and heater element position conforming to this embodiment.

EXAMPLE 4

Film thickness distribution based on the susceptor in the embodiment shown in FIG. 4 and the shower plate in the embodiment shown in FIG. 7.

Figure 8:
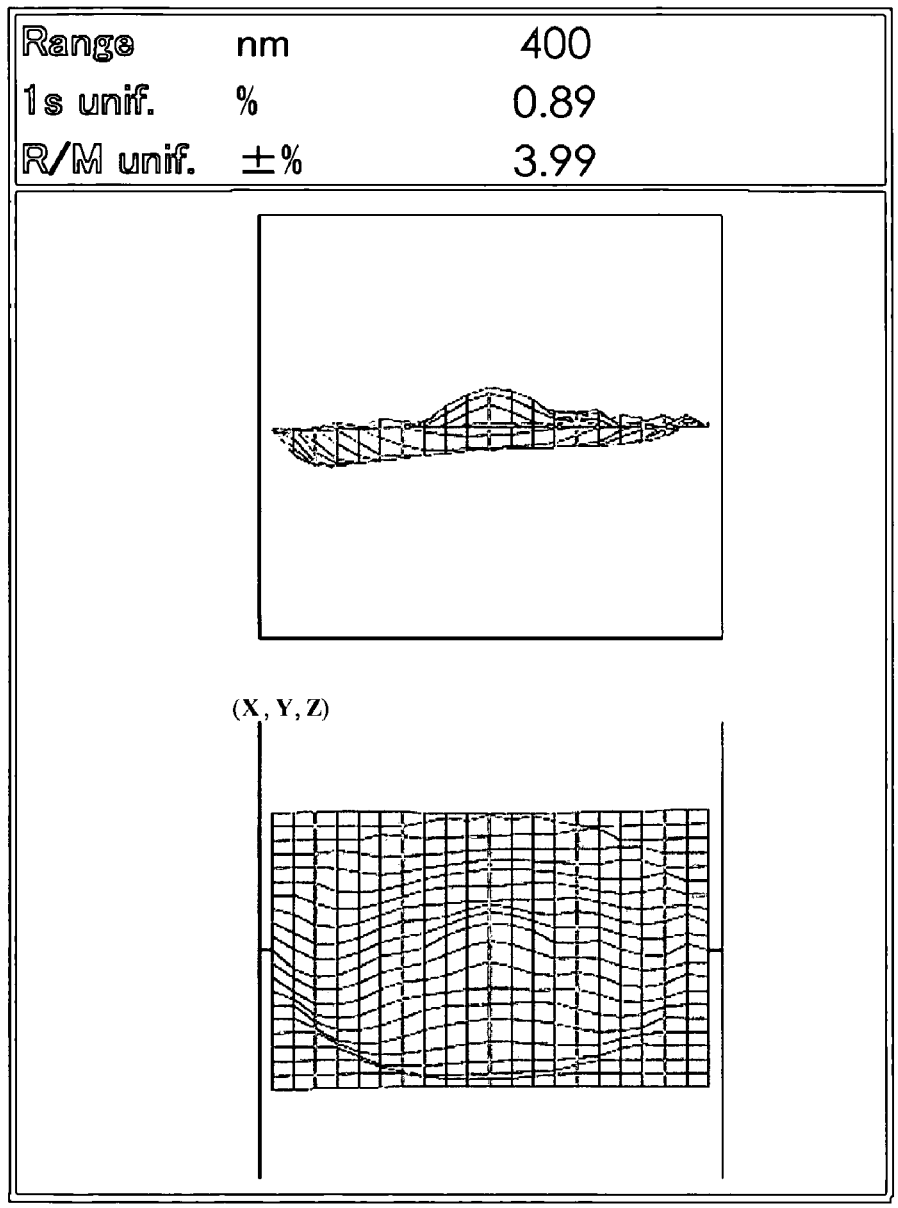
FIG. 8 is a graph showing a film thickness profile using the shower plate of FIG. 7.
Figure 9:
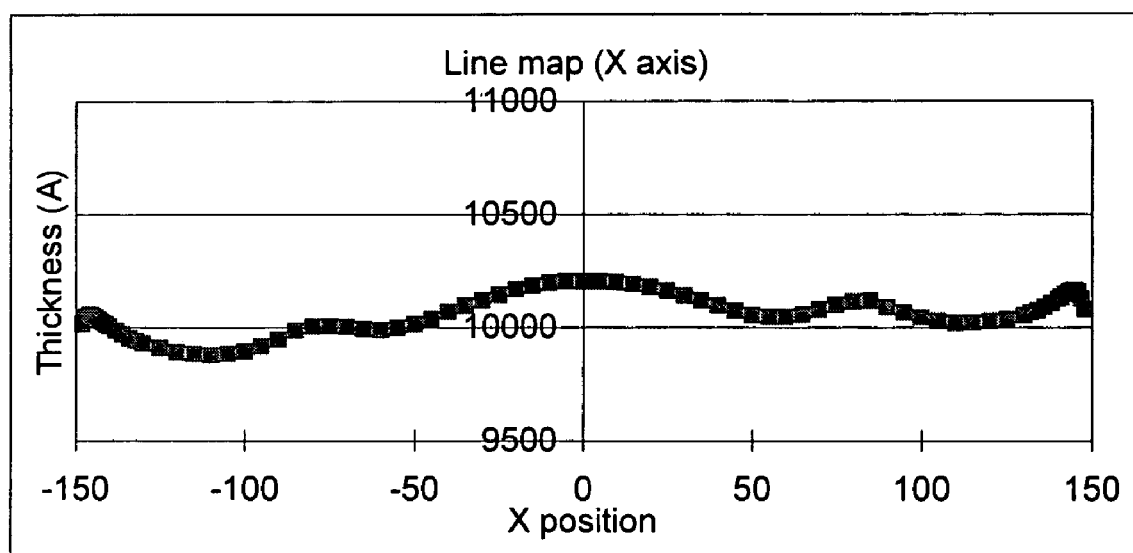
FIG. 9 is a graph showing a film thickness profile using the shower plate of FIG. 7.

FIGS. 8 and 9 show the film thickness distribution profiles obtained from this example. The deposition conditions are as follows:

Deposition Conditions
 First electrode: 170° C.
 Chamber wall: 150° C.
 Heater: 390° C.
 Material gas: DM-DMOS (dimethyl dimethoxy silane), 175 sccm
 Bridging gas: Isopropyl alcohol, 320 sccm
 Additive gas: He, 150 sccm
 First high-frequency power supply: 27.12 MHz, 2.3 W/cm2
 Wafer: 300 mm From FIGS. 8 and 9, it is clear that use of the shower plate, susceptor and heater element position conforming to the applicable embodiments resulted in a favorable film thickness distribution. Uniformity of the film quality was also maintained. In an embodiment where the shower plate obtained by overlaying functions was used, the film thickness increased at the substrate center because the area near the center had a concave shape, while the film thickness decreased at the substrate periphery because the area near the periphery had a concave shape. As a result, the uniformity improved over the level achieved with a shower plate having the basic shape (FIG. 6).

The above explained the present invention based on preferred examples. It should be noted, however, that the present invention is not at all limited to the descriptions provide herein. In a given embodiment, a plasma CVD film formation apparatus conforming to the present invention comprises the means specified below:

As explained above, in a given embodiment of the present invention a plasma CVD film formation apparatus for forming a thin film on a wafer comprises: a vacuum chamber; a shower plate installed inside the vacuum chamber; and a susceptor for placing the wafer thereon, installed substantially parallel to and facing the shower plate; wherein the surface of the shower plate facing the susceptor has a basic shape having a convex at the center and onto which multiple functions are overlaid; and wherein the susceptor holds the wafer at its periphery and other intermediate position between the center and periphery, thereby achieving favorable wafer temperature distribution as well as film thickness and quality distributions.

The aforementioned apparatus can also prevent scratching of the back surface of the wafer while suppressing rise in particle generation, due to a smaller contact area between the wafer and susceptor.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A plasma CVD apparatus for forming a thin film on a wafer, comprising:
 a reaction chamber;
 a susceptor for placing the wafer thereon installed inside the reaction chamber and having a convex-concave surface comprising an inner annular convex portion and an outer annular convex portion which are concentrically formed, wherein the inner annular convex portion is configured to support the wafer at a portion between a center and a periphery of the wafer, and the outer annular convex portion is configured to support the wafer at its periphery; and
 a shower plate for discharging a gas therethrough installed inside the reaction chamber substantially parallel to and facing the susceptor for generating a plasma therebetween, said shower plate having a convex-concave surface configured by a convex equation L which is a function of a radius R, on which a secondary equation M is overlaid, wherein the equation M is a function of a radius R and comprised of a concave equation at a central area and a convex equation at a peripheral area,
 wherein the convex-concave surface of the shower plate comprises an inner annular protrusion formed between an area defined by the concave equation and an area defined by the convex equation in the equation M, and an outer annular protrusion formed and defined by the convex equation in the equation M, wherein respective locations of the inner annular convex portion and the outer annular convex portion of the susceptor defined using a radius R are overlapped with respective locations of the inner annular protrusion and the outer annular protrusion of the shower plate defined using a radius R.

2. A plasma CVD apparatus for forming a thin film on a wafer, comprising:
 a reaction chamber;
 a susceptor for placing the wafer thereon installed inside the reaction chamber;
 a shower plate for discharging a gas therethrough installed inside the reaction chamber substantially parallel to and facing the susceptor for generating a plasma therebetween, said shower plate having a convex-concave surface configured by a convex equation L which is a function of a radius R, on which a secondary equation M is overlaid, wherein the equation M is a function of a radius R and comprised of a concave equation at a central area and a convex equation at a peripheral area,
 wherein the convex-concave surface of the shower plate comprises an inner annular protrusion formed between an area defined by the concave equation and an area defined by the convex equation in the equation M, and an outer annular protrusion formed and defined by the convex equation in the equation M,
 wherein respective locations of the inner annular protrusion and the outer annular protrusion of the shower plate defined using a radius R are such that a thin film formed using a shower plate equivalent to the shower plate without the inner and outer annular protrusions has a thickness distribution having two annular peaks at locations corresponding to the locations of the inner and outer annular protrusions of the shower plate as viewed in cross sections.

3. The plasma CVD apparatus according to claim 1, wherein respective locations of the shower plate where the concave equation and the convex equation in the equation M are overlaid correspond to respective locations of a relatively thin portion and a relatively thick portion of a film formed on a wafer using a shower plate having a surface configured by the equation L.

4. The plasma CVD apparatus according to claim 1, wherein the equation M is a function of R to the second power.

5. The plasma CVD apparatus according to claim 4, wherein the equation M is expressed by $$M = h\left(1 - \frac{(R-j)^2}{i}\right),$$

wherein h, i, and j are coefficients.

6. The plasma CVD apparatus according to claim 1, wherein the equation L is expressed by $$L = \frac{e^2 f}{R^2 + e^2} - \frac{e^2 f}{g^2 + e^2},$$

wherein e, f, and g are constants.

7. The plasma CVD apparatus according to claim 1, wherein the equation L is such that a height of a convex portion of the shower plate at a center is about 0.5 mm to about 3.5 mm.

8. The plasma CVD apparatus according to claim 1, wherein the inner convex portion of the susceptor is arranged within a region defined by a distance from a center, which is about 40% to about 60% of a radius of the wafer, and the outer convex portion of the susceptor is arranged within a region defined by a distance from the center, which is about 90% to 100% of the radius of the wafer.

9. The plasma CVD apparatus according to claim 1, wherein the susceptor comprises a heater element embedded therein within a region defined by a distance from a center, which is about 20% to about 60% of a radius of the wafer.

10. The plasma CVD apparatus according to claim 1, wherein the inner and outer convex portions of the susceptor each have a height of about 0.3 mm to about 1.5 mm.

11. The plasma CVD apparatus according to claim 2, wherein the equation L is such that a height of a convex portion of the shower plate at a center is about 0.5 mm to about 3.5 mm.

12. The plasma CVD apparatus according to claim 2, wherein the inner convex portion of the susceptor is arranged within a region defined by a distance from a center, which is about 40% to about 60% of a radius of the wafer, and the outer convex portion of the susceptor is arranged within a region defined by a distance from the center, which is about 90% to 100% of the radius of the wafer.

13. The plasma CVD apparatus according to claim 2, wherein the susceptor comprises a heater element embedded therein within a region defined by a distance from a center, which is about 20% to about 60% of a radius of the wafer.

14. The plasma CVD apparatus according to claim 2, wherein the inner and outer convex portions of the susceptor each have a height of about 0.3 mm to about 1.5 mm.

* * * * *

UNITED STATES PATENT AND TRADEMARK OFFICE
CERTIFICATE OF CORRECTION

PATENT NO. : 7,418,921 B2  Page 1 of 1
APPLICATION NO. : 11/202492
DATED : September 2, 2008
INVENTOR(S) : Naoto Tsuji and Satoshi Takahashi It is certified that error appears in the above-identified patent and that said Letters Patent is hereby corrected as shown below:

Column 1, line 65; Change "O300 mm" to --Ø300 mm--.

Column 6, line 65; Change "120," to --Ø120--.

Signed and Sealed this

Twenty-eighth Day of April, 2009

JOHN DOLL
*Acting Director of the United States Patent and Trademark Office*